United States Patent [19]

Hanawa

[11] Patent Number: 5,429,910

[45] Date of Patent: Jul. 4, 1995

[54] METHOD OF FORMING A CRITICAL RESIST PATTERN

[75] Inventor: Tetsuro Hanawa, Hyogo, Japan

[73] Assignee: Mitsubishi Denki Kabushiki Kaisha, Tokyo, Japan

[21] Appl. No.: 60,118

[22] Filed: May 12, 1993

[30] Foreign Application Priority Data

Dec. 17, 1992 [JP] Japan .................................. 4-337226

[51] Int. Cl.⁶ .............................................. G03F 7/38
[52] U.S. Cl. .................................. 430/313; 430/325; 430/326; 430/330; 430/961
[58] Field of Search .............. 430/313, 325, 326, 330, 430/271, 273, 961

[56] References Cited

U.S. PATENT DOCUMENTS

| 4,981,770 | 1/1991 | Taylor | 430/326 |
| 5,240,812 | 8/1993 | Conley | 430/273 |
| 5,258,266 | 11/1993 | Tokui | 430/326 |
| 5,326,675 | 7/1994 | Niki | 430/326 |

OTHER PUBLICATIONS

"Sensitive Electron Beam Resist Systems Based on Acid-Catalyzed Deprotection", by Hiroshi Ito, SPIE vol. 1086 Advances in Resist Technology and Processing VI, 1989, pp. 11-21.

*Primary Examiner*—Kathleen Duda
*Attorney, Agent, or Firm*—Lowe, Price, LeBlanc & Becker

[57] ABSTRACT

A resist pattern having an accurate rectangular sectional configuration and high dimension controllability can be formed using a conventional chemical amplification positive type resist. A chemical amplification positive type resist layer 3 including a base resin, and a protonic acid generating agent decomposed by photochemical reaction to generate protonic acid and a dissolution inhibitor is formed on a semiconductor substrate 2. Light 8 is selectively directed to the chemical amplification positive type resist layer 3 to form an image. The chemical amplification positive type resist layer 3 after irradiation of light 8 has its surface treated with an acid solution 1 so that the surface of the resist layer 3 includes acid. The chemical amplification positive type resist layer 3 treated with acid is baked and then developed to form a resist pattern 7.

18 Claims, 10 Drawing Sheets

FIG. 2(a)   H2SO4, HNO3, CH3COOH

FIG. 6(a)
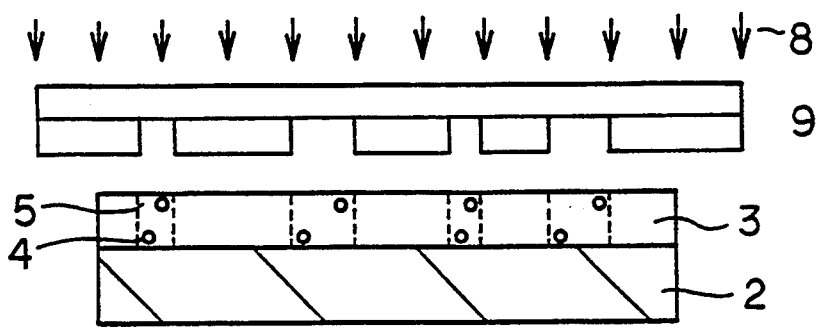
FIG. 6(b)
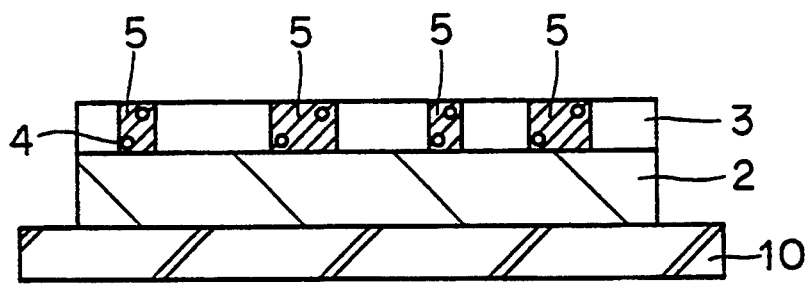
FIG. 6(c)
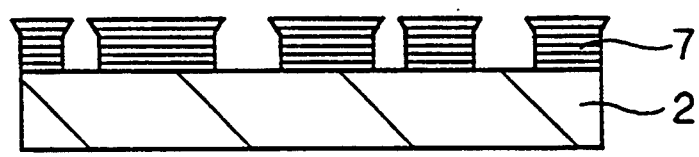

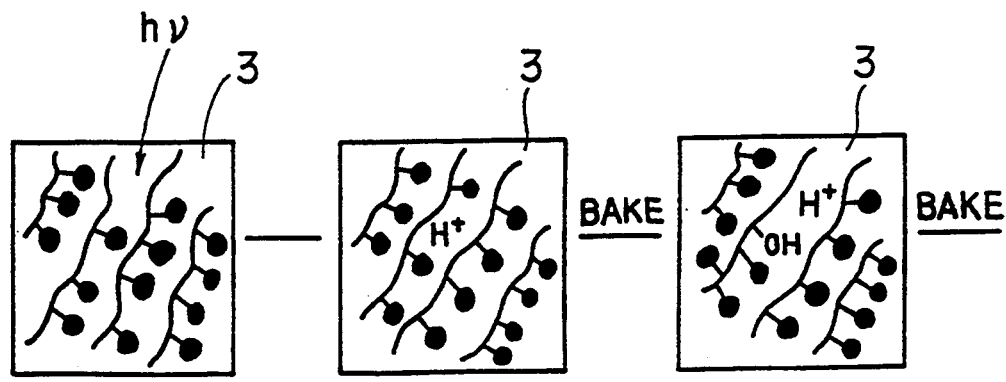
FIG. 9(a)　　FIG. 9(b)　　FIG. 9(c)
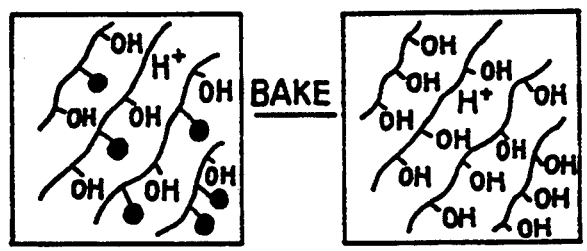
FIG. 9(d)　　FIG. 9(e)
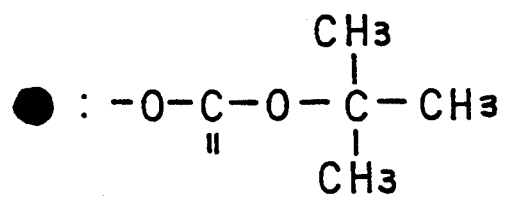

METHOD OF FORMING A CRITICAL RESIST PATTERN

BACKGROUND OF THE INVENTION

1. Field of the Invention

The present invention relates to a method of forming a critical resist pattern, and more particularly to a method of forming a critical resist pattern improved so as to form a resist pattern having an accurate rectangular sectional configuration and high dimension controllability.

2. Description of the Background Art

In the manufacturing process of a device equal to or greater than 64MDRAM, there is the need of development of quarter micron lithography. In the current lithography process using deep UV light from an excimer laser and the like, a 3 component chemical amplification positive type resist is employed including an acid generating agent decomposed by photochemical reaction to generate acid, a base resin including a functional group having low absorption with respect to deep UV light and that decomposes by acid catalyst, and in which solubility with respect to alkali developing solution is increased at the light irradiated area, and a dissolution inhibitor. Also, a 2 component chemical amplification positive type resist not including dissolution inhibitor is employed.

FIG. 7 shows the chemical structural formula of a base resin which is the structural component of a 2 component chemical amplification positive type resist (SPIE Vol. 1086 Advances in Resist Technology and Processing VI (1989)). Referring to FIG. 7, it is appreciated that the base resin is a poly (p-t-butoxycarbonyl-oxy-styrene) having t-butyl oxycarbonyl (referred to as t-BOC group hereinafter) coupled to poly-p-hydroxy styrene, where n is a natural number representing the polymerization degree. The acid generating agent shown in FIG. 8(a) is triphenyl sulfonium hexafluoro antimonate. As shown in FIG. 8(b), triphenyl sulfonium hexafluoro antimonate generates protonic acid by being subjected to light irradiation.

A conventional method of forming a resist pattern using a chemical amplification positive type resist including these base resin and acid generating agent will be described with reference to FIG. 6.

Referring to FIG. 6(a), a chemical amplification positive type resist 3 for excimer laser lithography is spin-coated to a film thickness of approximately 1.0 μml-5 μm on a semiconductor substrate 2. Then, this is soft-baked at a temperature within the range of 80° C.-130° C.

Referring to FIG. 6(b), excimer laser light 8 for forming an image is selectively directed to chemical amplification positive type resist layer 3 via a reticle 9. The exposed portion 5 of chemical amplification positive type resist 3 has triphenyl sulfonium hexafluoro antimonate decomposed to generate protonic acid 4, as shown in FIG. 8.

Referring to FIG. 6(c), semiconductor substrate 2 is mounted on a hot plate 10, whereby chemical amplification positive type resist layer 3 is baked for 1-2 minutes at a temperature of 60° C.-100° C. This process is called post exposure baking (referred to as PEB hereinafter). This PEB causes the t-BOC group in the base resin to be released in the exposed portion 5, whereby solubility of the base resin with respect to the alkali developing solution is increased.

The release of the t-BOC group in the base resin by acid catalysis will be described in details with reference to FIG. 9.

Referring to FIG. 9(a), excimer laser light is directed to chemical amplification positive type resist layer 3. This causes triphenyl sulfonium hexafluoro antimonate in chemical amplification positive type resist layer 3 to be decomposed to generate protonic acid, as shown in FIG. 9(b).

Referring to FIG. 9(c), chemical amplification positive type resist layer 3 is baked, whereby t-BOC functional group is released from poly (p-t-butoxycarbonyl-oxy-styrene) to generate hydroxyl group according to the reaction formula shown in FIG. 10. Continuation of this baking process promotes the release of the t-BOC functional group as shown in FIG. 9(d). Finally, the base resin is converted to poly vinyl phenol that is soluble in an alkali developing solution, as shown in FIG. 9(e).

FIG. 11 shows the difference in the dissolution rate between poly (p-t-butoxycarbonyl-oxy-styrene) and poly (p-hydroxy styrene), i.e. the difference of dissolution rate between the exposed portion and the not-exposed portion of a chemical amplification positive type resist with respect to an alkali developing solution. It is appreciated from FIG. 11 that the dissolution rate with respect to an alkali developing solution in the exposed portion of the chemical amplification positive type resist increases.

By eluting the exposed portion 5 of resist film 3 with an alkali developing solution of an appropriate concentration, a resist pattern 7 of high sensitivity and high resolution is obtained.

Thus, high sensitivity and high resolution can be achieved with excimer laser lithography employing a conventional chemical amplification positive type resist.

However, exposure of a chemical amplification positive type resist layer is carried out in a clean room. The atmosphere in a clean room includes oxygen and a small amount of basic components (ammonia, amine and the like from the developing solution). Therefore, at the surface of a chemical amplification positive type resist layer that is in contact with the atmosphere in the clean room, acid generated by deep UV light irradiation and reaction intermediates generated during acid generation will react with oxygen and basic components in the atmosphere. This produced a problem that solubility with respect to an alkali developing solution is significantly reduced at the surface of the chemical amplification positive type resist layer.

This problem will be described in detail with reference to FIG. 12.

FIG. 12(a) has the distance between the surface of a resist and a substrate (thickness of the resist) plotted along the abscissa and the acid concentration (arbitrary unit) plotted along the ordinate. FIG. 12(b) has the distance between the surface of a resist to a substrate (thickness of the resist) plotted along the abscissa and dissolution rate with respect to an alkali developing solution is plotted along the ordinate.

It can be appreciated from FIGS. 12(a) and 12(b) that an exposed chemical amplification positive type resist left in a clean room will exhibit reduction in acid concentration in the portion of thickness Δx at the surface layer of the resist. This means that solubility with respect to an alkali developing solution is reduced in the portion of thickness Δx. Δx is 200–500Å.

Referring to FIG. 12(c), an insoluble layer is formed at the portion of thickness Δx at the surface layer of resist pattern 7, resulting in the generation of a projecting corner 7a at the top portion of resist pattern 7. The generation of a projecting corner 7a will prevent the provision of a resist pattern having an accurate rectangular sectional configuration and high dimension controllability.

SUMMARY OF THE INVENTION

In view of the foregoing, an object of the present invention is to provide a method of forming a resist pattern having an accurate rectangular sectional configuration using a conventional chemical amplification positive type resist.

Another object of the present invention is to provide a method of forming a resist pattern having high dimension controllability using a conventional chemical amplification positive type resist.

A further object of the present invention is to provide a method of forming a resist pattern of a line and space of 0.25 μm–0.30 μm.

Still another object of the present invention is to provide a method of forming a resist pattern allowing formation of a contact hole of 0.30 μm–0.35 μm.

According to a method of forming a critical resist pattern of the present invention, a chemical amplification positive type resist layer including a base resin and a protonic acid generating agent which decomposes according to photochemical reaction to generate protonic acid is formed on a semiconductor substrate. Light is selectively directed to form an image on the chemical amplification positive type resist layer. This irradiated chemical amplification positive type resist layer has its surface treated with acid to include acid at its surface. The chemical amplification positive type resist layer treated with acid is baked (PEB). The chemical amplification positive type resist layer is developed, whereby a resist pattern is formed.

According to the method of forming a critical resist pattern of the present invention, the surface of the chemical amplification positive type resist layer is processed with acid to include acid at the surface of the resist layer after light irradiation and immediately before PEB, whereby the concentration of acid at the surface of the resist layer is increased. Therefore, even when basic compound or oxygen included in the atmosphere of a clean room comes into contact with the surface of the resist layer, the formation of an insoluble layer caused by acid concentration reduction is suppressed because the concentration of acid at the surface is high enough.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2a–2e show an example of the structural material of an acid solution used in the present invention.

FIGS. 6a–6c are a partial sectional view of a semiconductor device using a 2 component chemical amplification positive type resist showing sequential steps of a conventional resist pattern formation.

FIGS. 9a–9e schematically show the chemical reaction in the exposed portion of a chemical amplification positive type resist using poly (p-t-butoxycarbonyl-oxy-styrene) as the base resin.

FIGS. 12a–12e shows the problem encountered in the method of forming a conventional critical resist pattern using a chemical amplification positive type resist.

DESCRIPTION OF THE PREFERRED EMBODIMENTS

FIG. 1 is a partial sectional view of a semiconductor device according to an embodiment of the present invention showing sequential steps of forming a critical resist pattern.

Figure 1A:
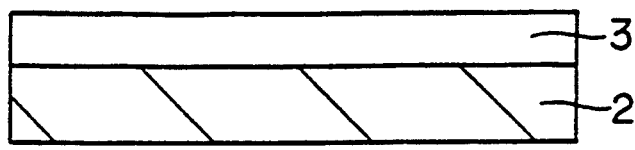
FIGS. 1a–1e are partial sectional view of a semiconductor device according to an embodiment of the present invention showing sequential steps of forming a critical resist pattern.

Referring to FIG. 1(a), a chemical amplification positive type resist layer 3 including a base resin including poly (p-t-butoxycarbonyl-oxy-styrene) and triphenyl sulfonium hexafluoro antimonate is spin-coated to a thickness of approximately 1.0–1.5 μm on a semiconductor substrate 2, followed by a soft-baking process at a temperature of 80° C.–130° C. The chemical amplification positive resist layer 3 can include a dissolution inhibitor.

Figure 1B:
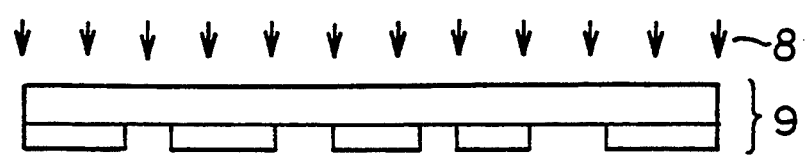
Figure 8A:
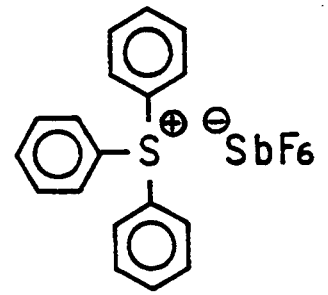
FIGS. 8a and 8b are a chemical formula and the light decomposition reaction of triphenyl sulfonium hexafluoro antimonate which is an acid generating agent.
Figure 8B:
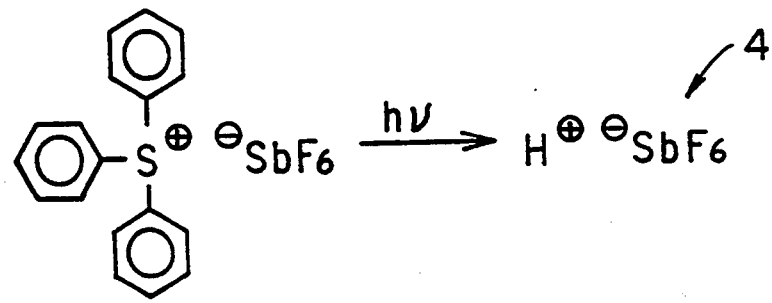
Figure 10:
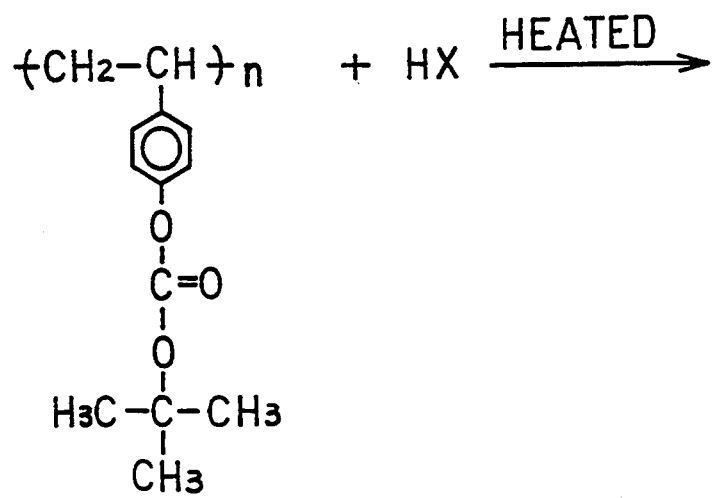
FIG. 10 is the chemical formula of the release reaction of t-BOC functional group by acid catalysis in a conventional 2 component chemical amplification positive type resist.
Figure 10:
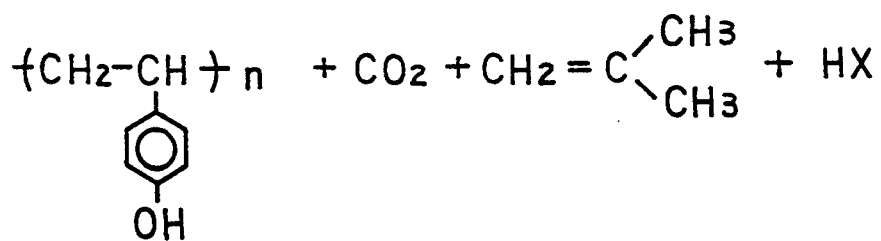
Figure 11:
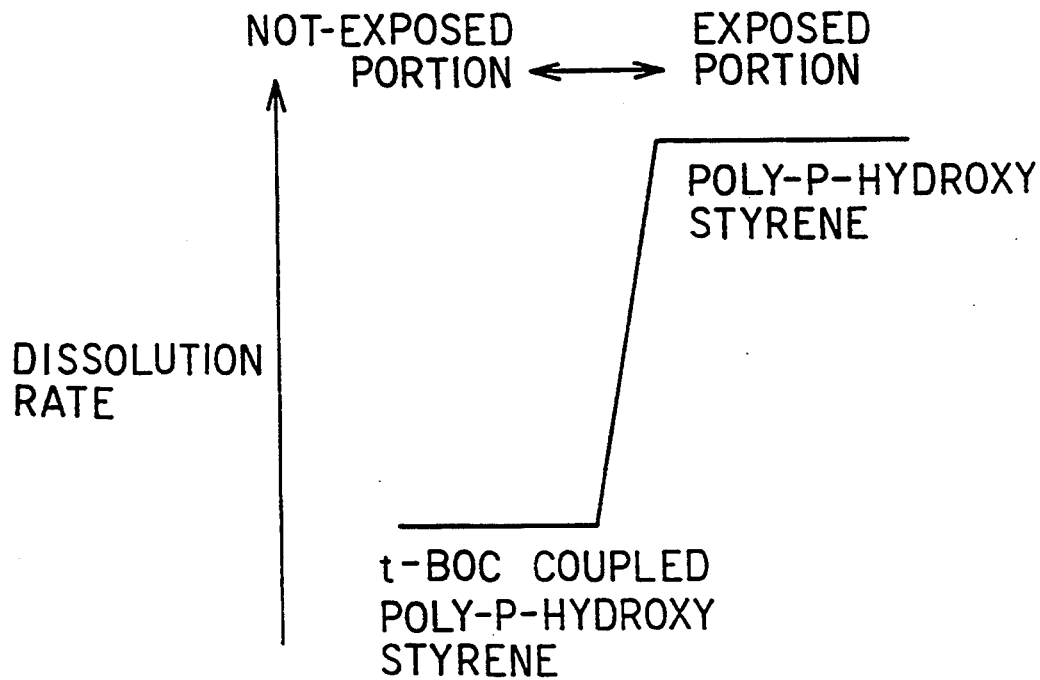
FIG. 11 schematically shows the difference in dissolution rate between poly (p-t-butoxycarbonyl-oxystyrene) and poly-p-hydroxy styrene with respect to the developing solution.
Figure 12A:
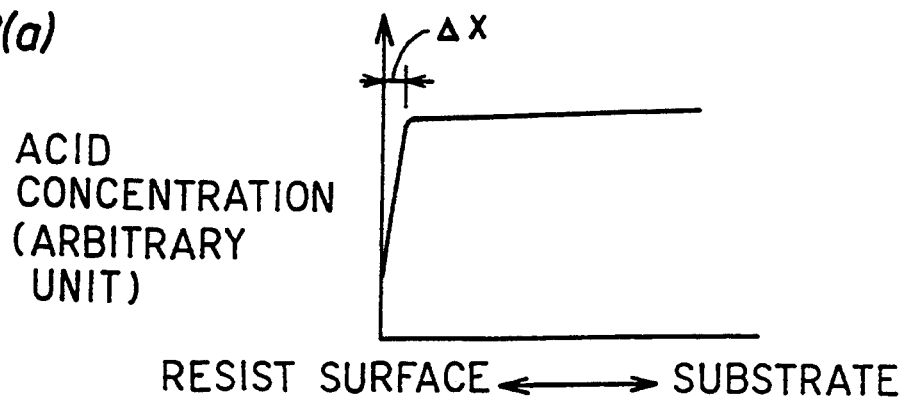
Figure 12B:
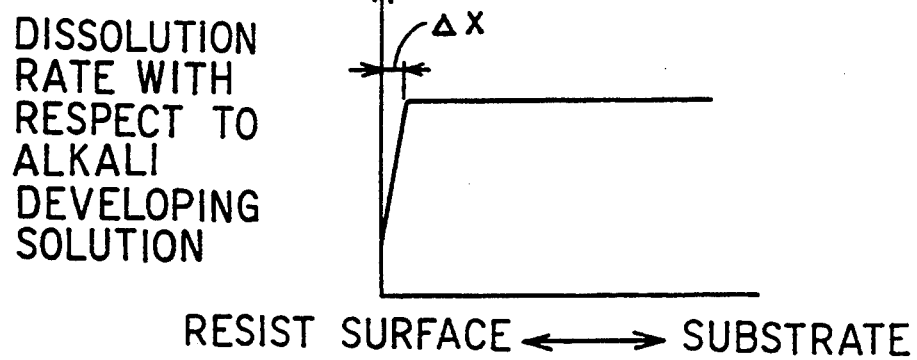
Figure 12C:
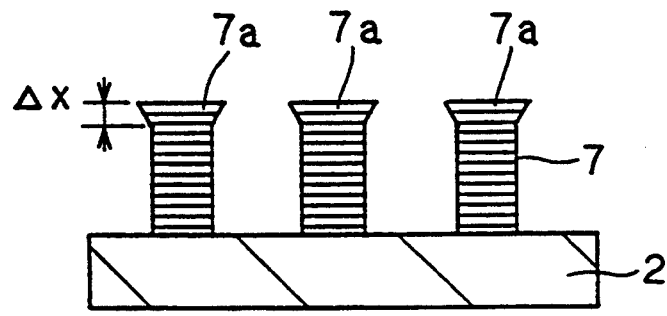
Figure 13A:
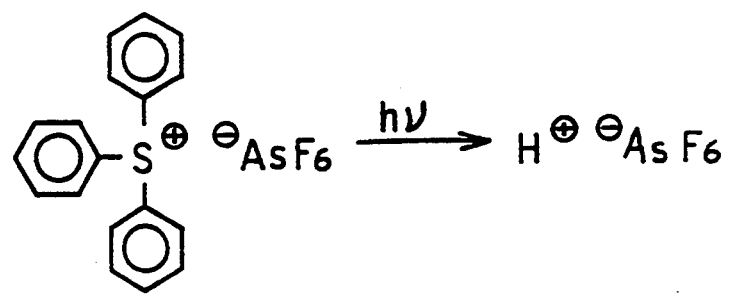
FIGS. 13a and 13b show another example of a protonic acid generating agent used in the present invention.
Figure 13B:
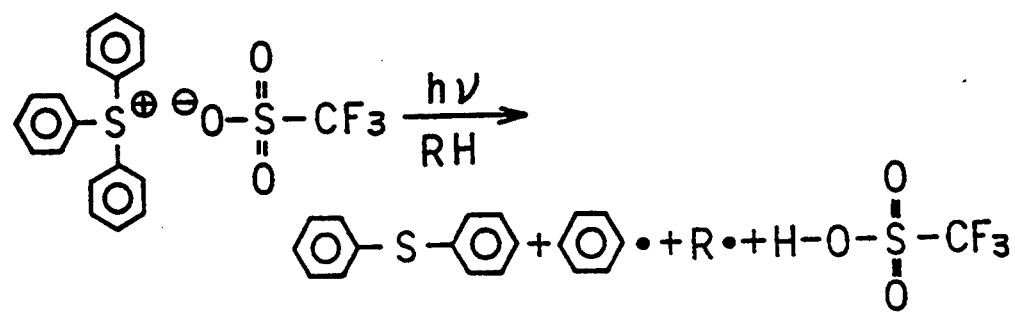

Referring to FIG. 1(b), excimer laser light 8 is selectively directed to chemical amplification positive type resist layer 3 via a reticle 9 to form an image. In the portion irradiated by excimer laser light 8, i.e. exposed portion 5, protonic acid 4 is generated according to the reaction formula shown in FIG. 8.

Figure 1C:
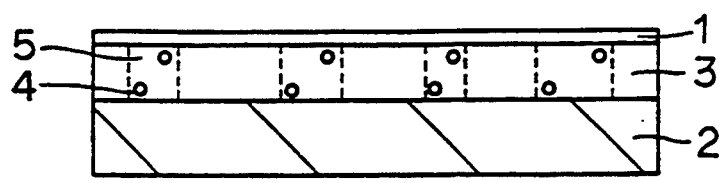

Referring to FIG. 1(c), acid solution 1 is applied to the surface of chemical amplification positive type resist layer 3 after exposure and right before PEB, whereby acid solution 1 and the surface of resist layer 3 is brought into contact for 30 seconds—2 minutes.

Figure 2B:
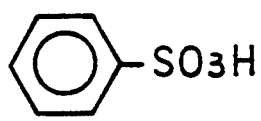
Figure 2B:
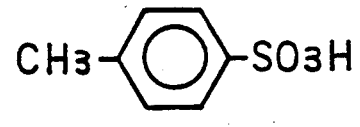
Figure 2C:
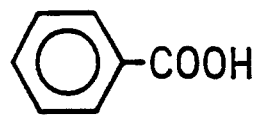
Figure 2C:

The acid solution preferably includes solution with inorganic acid such as sulfuric acid, nitric acid, and acetic acid as the structural component (FIG. 2 (a)), solution with organic sulfonic acid such as benzene sulfonic acid and p-toluensulfonic acid as the structural component (FIG. 2(b)), or solution with organic carboxylic acid such as benzoic acid and phthalic acid as the structural component (FIG. 2(c)).

When inorganic acid solution is used, the concentration thereof is preferably 0.001N–1N. When organic acid solution is used, a concentration within the range of 0.001N—saturation solubility is preferred.

A specific method of applying acid solution to the surface of the chemical amplification positive type resist layer will be described hereinafter.

Figure 3:
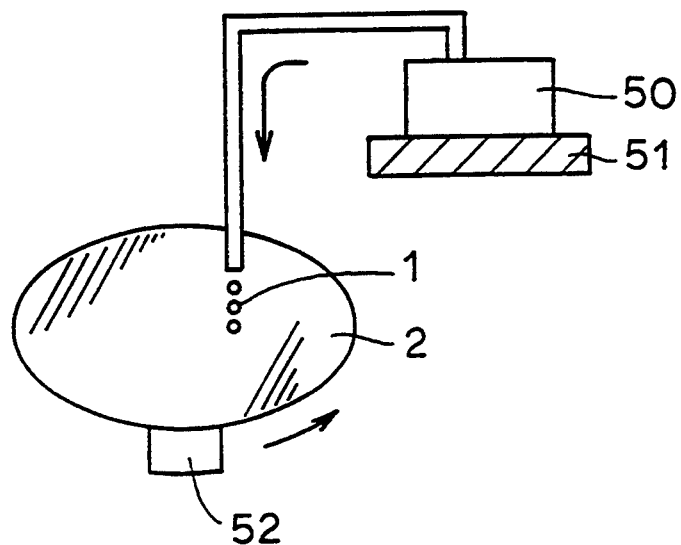
FIG. 3 shows a spin coat method employed in the present invention.

Referring to FIG. 3, a vessel 50 storing acid solution is mounted on a heater 51, whereby the acid solution is heated to a temperature within the range of room temperature to 80° C. While semiconductor substrate 2 having a chemical amplification positive type resist layer formed is rotated by a motor 52, the heated acid solution 1 is supplied onto semiconductor substrate 2. Acid solution is applied to the surface of the chemical amplification positive type resist layer by the above-described method.

Figure 5A:
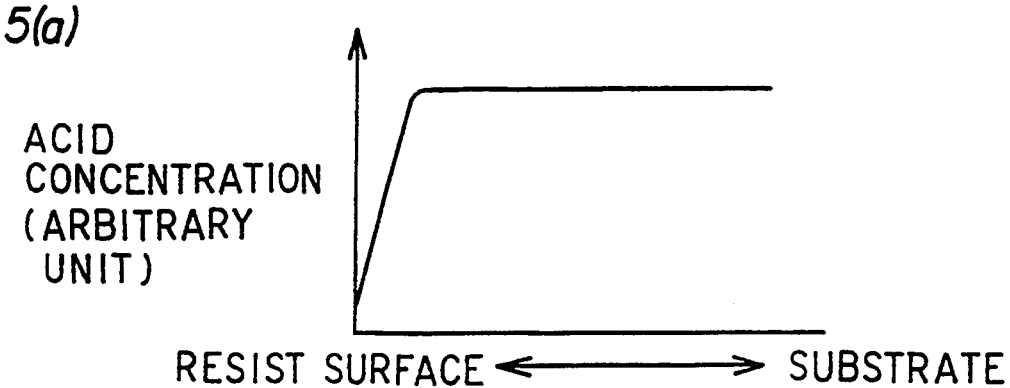
FIGS. 5a–5c show the change in acid concentration distribution at the surface of a chemical amplification positive type resist layer when treated with acid solution.

FIG. 5(a) shows that the concentration of the acid generated by deep UV light irradiation is decreased in the proximity of the surface of the chemical amplification positive type resist layer due to the small amount of basic compound or oxygen in the atmosphere of a clean room. In the graph of FIG. 5(a), the abscissa represents the distance from the surface of the resist to the substrate (thickness of the resist), and the ordinate represents the acid concentration (arbitrary unit).

Figure 5B:
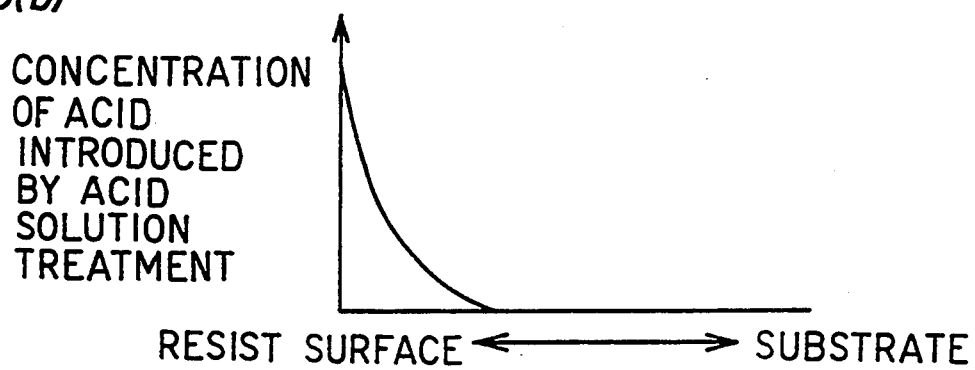

FIG. 5(b) shows the concentration distribution of acid caused by acid substance in the film thickness direction of the chemical amplification positive type resist when treated with acid solution. In the graph of FIG. 5(b), the abscissa represents the distance from the surface of the resist to the substrate (thickness of the resist), and the ordinate represents the concentration of acid (arbitrary unit) introduced to the surface of the resist layer.

Figure 5C:
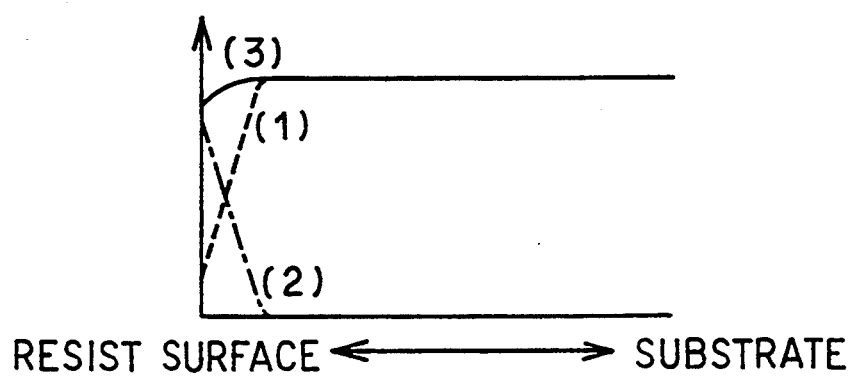
Figure 7:
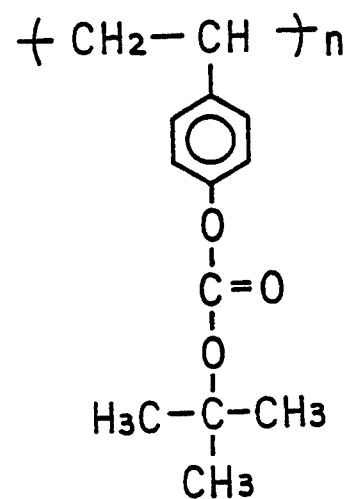
FIG. 7 shows an example of the base resin of a conventional 2 component chemical amplification positive type resist.

FIG. 5(c) shows the concentration distribution of acid in the film thickness direction of the chemical amplification positive type resist layer when the effect of (a) and (b) are combined. In the graph of FIG. 5(c), the broken line (1) represents the effect of (a), the chain dotted line (2) represents the effect of (b), and the solid line (3) represents the combined effects of (a) and (b). It can be appreciated from FIG. 5(c) that reduction in the acid concentration at the resist surface is suppressed even when the semiconductor substrate is left in a clean room by virtue of the surface of the resist layer being treated with an acid solution.

Figure 1D:
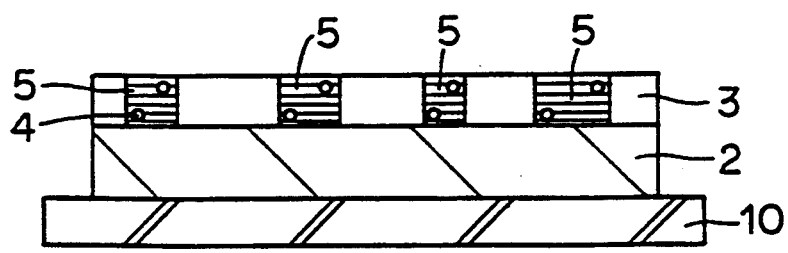
Figure 1E:
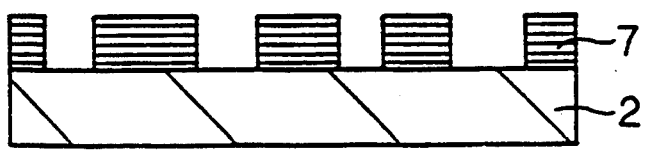

Referring to FIG. 1(d), a semiconductor substrate 2 is placed on a hot plate 10 to be subjected to a baking process (PEB) for 1–2 minutes at a temperature of 60° C.–100° C. This PEB causes the t-BOC functional group to be selectively released from the base resin at exposed portion 5. Therefore, the solubility with respect to an alkali developing solution at exposure portion 5 is increased.

Referring to FIGS. 1(d) and (e), exposed portion 5 of chemical amplification positive type resist layer 3 is eluted by an alkali developing solution of an appropriate concentration to form a resist pattern 7.

According to this method, the surface of chemical amplification positive type resist layer 3 is treated with acid after light irradiation and immediately before PEB so that the surface of the resist layer includes acid as shown in FIG. 1(c), whereby the concentration of acid at the surface of resist layer 3 is increased. Therefore, the formation of an insoluble layer caused by reduction in acid concentration is suppressed even if basic compound or oxygen included in the atmosphere of the clean room comes into contact with the surface of the resist layer. As a result, a resist pattern having an accurate rectangular sectional configuration and high dimension controllability is formed. The line and space of the obtained resist pattern approximates the target value of 0.25 μm–0.30 μm.

Although the acid treatment was carried out by applying acid solution on the semiconductor substrate in the above embodiment, the present invention is not limited to this, and the acid treatment may be carried out by bringing into contact acid vapor at the surface of the chemical amplification positive type resist layer. This will be described in details with reference to FIG. 4.

Figure 4:
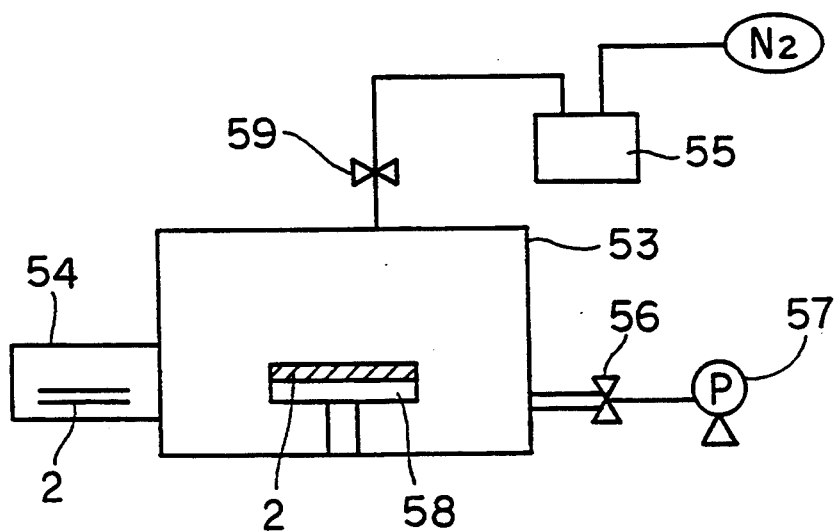
FIG. 4 shows an acid vapor processing method employed in the present invention.

FIG. 4 schematically shows an apparatus for carrying out acid treatment with vapor of acid gas. A loader chamber 54 is connected to a processing chamber 53. A semiconductor substrate 2 having a chemical amplification positive type resist layer formed is placed in loader chamber 54. An acid source 55 storing an acid solution is provided in the proximity of processing chamber 53. A bomb of $N_2$ gas is connected to acid source 55 so that the acid solution in acid source 55 can be bubbled. A pump 57 is connected to processing chamber 53 via a valve 56. A support bed 58 for fixing semiconductor substrate 2 is provided in processing chamber 53.

The operation thereof will be described hereinafter. Semiconductor substrate 2 is conveyed from loader chamber 54 to support bed 58 in processing chamber 53. The interior of processing chamber 53 has an appropriate pressure by driving pump 57 and adjusting valve 56. Acid vapor is generated by bubbling nitride gas in the acid solution stored in acid source 55. The acid gas is introduced into processing chamber 53 by opening valve 59. The acid vapor comes into contact with the surface of the chemical amplification positive type resist layer. As a result, the surface of the chemical amplification positive type resist layer is treated with acid. By such an acid treatment carried out using acid vapor, an effect similar to that of the aforementioned spin coating method is realized.

The acid process is not limited to the above described spin coating method and the vapor processing method, and may be carried out by dipping the semiconductor substrate in an acid solution.

Although poly (p-t-butoxycarbonyl-oxy-styrene) is described as the base resin included in the chemical amplification positive type resist layer in the above embodiment, the present invention is not limited to this.

Also, although triphenyl sulfonium hexafluoro antimonate is described as the acid generating agent in the above embodiment, the present invention is not limited to this, and triphenyl sulfonium hexafluoro arsenate, triphenyl sulfonium trifluoro methanesulfonate and the like can preferably be used.

Thus, according to a method of manufacturing a critical resist pattern of the present invention, the surface of the chemical amplification positive type resist layer is treated with acid to include acid at the surface of the resist layer after light irradiation and right before PEB, whereby the concentration of acid at the surface of the resist layer is increased. Therefore, even if basic compound or oxygen included in the atmosphere of the clean room is brought into contact with the surface of the resist layer, formation of an insoluble layer caused by reduction in acid concentration is suppressed because the concentration of acid at the surface is high enough. As a result, a resist pattern can be formed having an accurate rectangular sectional configuration and high dimension controllability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a critical resist pattern, comprising the steps of:
    forming a chemical amplification positive type resist layer including a base resin and a protonic acid generating agent decomposed by photochemical reaction to generate protonic acid on a semiconductor substrate,
    selectively directing light to said chemical amplification positive type resist layer to form an image and to form protonic acid in exposed areas of the chemical amplification positive type resist layer,
    treating the surface of said chemical amplification positive type resist layer with acid after irradiation of said light so that the surface of said resist layer includes acid, the acid being selected from the group consisting of sulfuric acid solution, nitric acid solution, organic sulfonic acid solution, organic carboxylic acid solution and acetic acid solution,
    baking said acid treated chemical amplification positive type resist layer, and
    developing said chemical amplification positive type resist layer to form a resist pattern.

2. The method according to claim 1, wherein said acid treatment is carried out by dipping said semiconductor substrate in a solution of acid.

3. The method according to claim 1, wherein the acid treatment is carried out by applying solution of acid on said semiconductor substrate.

4. The method according to claim 3, wherein the acid treatment is carried out by applying on said semiconductor substrate acid heated at a temperature from room temperature up to 80° C.

5. The method according to claim 1, wherein the acid treatment is carried out by bringing into contact the surface of said chemical amplification positive type resist layer with vapor of acid.

6. The method according to claim 1, wherein the acid treatment is carried out with heating at a temperature from room temperature up to 80° C.

7. The method according to claim 1, wherein said base resin comprises poly (p-t-butoxycarbonyl-oxystyrene).

8. The method according to claim 1, wherein said acid comprises sulfuric acid solution or nitric acid solution.

9. The method according to claim 8, wherein the concentration of said acid is 0.001N–1N.

10. The method according to claim 1, wherein said acid comprises organic sulfonic acid solution or organic carboxylic acid solution.

11. The method according to claim 10, wherein the concentration of said organic acid in solution is within a range of from 0.001N to a saturation concentration of the acid in solution.

12. The method according to claim 1, wherein said light comprises deep UV light.

13. The method according to claim 12, wherein said deep UV light comprises excimer laser light.

14. The method according to claim 1, wherein said protonic acid generating agent is selected from the group consisting of triphenyl sulfonium hexafluoro antimonate, triphenyl sulfonium hexafluoro arsenate, and triphenyl sulfonium trifluoro methanesulfonate.

15. The method according to claim 1, wherein said chemical amplification positive type resist layer further includes a dissolution inhibitor.

16. The method according to claim 1, wherein the acid comprises acetic acid.

17. The method according to claim 1, wherein the organic sulfonic acid solution comprises benzene sulfonic acid solution or p-toluene sulfonic acid solution.

18. The method according to claim 1, wherein the organic carboxylic acid solution comprises benzoic acid solution or phthalic acid solution.

* * * * *